US010734191B2

(12) United States Patent
Kishimoto et al.

(10) Patent No.: US 10,734,191 B2
(45) Date of Patent: Aug. 4, 2020

(54) CHARGED PARTICLE BEAM DEVICE

(71) Applicant: Hitachi High-Technologies Corporation, Minato-ku, Tokyo (JP)

(72) Inventors: Takanori Kishimoto, Tokyo (JP); Ichiro Tachibana, Tokyo (JP); Naomasa Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 15/741,899

(22) PCT Filed: Jul. 6, 2015

(86) PCT No.: PCT/JP2015/069372
§ 371 (c)(1),
(2) Date: Jan. 4, 2018

(87) PCT Pub. No.: WO2017/006408
PCT Pub. Date: Jan. 12, 2017

(65) Prior Publication Data
US 2018/0204706 A1    Jul. 19, 2018

(51) Int. Cl.
*H01J 37/22* (2006.01)
*H01J 37/244* (2006.01)
(Continued)

(52) U.S. Cl.
CPC .............. *H01J 37/22* (2013.01); *H01J 37/10* (2013.01); *H01J 37/21* (2013.01); *H01J 37/244* (2013.01);
(Continued)

(58) Field of Classification Search
CPC .. H01J 37/00; H01J 37/02; H01J 37/04; H01J 37/063; H01J 37/147; H01J 37/22;
(Continued)

(56) References Cited

U.S. PATENT DOCUMENTS 4,714,833 A * 12/1987 Rose .................... H01J 37/153
250/310
4,922,097 A * 5/1990 Todokoro ............. G01R 31/305
250/310
(Continued)

FOREIGN PATENT DOCUMENTS

JP    58-148867 U    10/1983
JP    59-9843 A    1/1984
(Continued)

OTHER PUBLICATIONS

International Search Report (PCT/ISA/210) issued in PCT Application No. PCT/JP2015/069372 dated Sep. 8, 2015 with English-language translation (Six (6) pages).
(Continued)

*Primary Examiner* — Jason L McCormack
(74) *Attorney, Agent, or Firm* — Crowell & Moring LLP

(57) ABSTRACT

This charged particle beam device is provided with: a plurality of detectors for detecting secondary particles, the detectors being disposed in a symmetrical manner around the optical axis of a primary charged particle beam closer to the charged particle source side than an objective lens; electrodes for forming an electric field oriented in directions corresponding to each of the plurality of detectors, the electrodes being provided on the travel routes of secondary particles from a sample to the detectors; and a control power supply for applying a voltage to the electrodes. Adjusting the voltage applied to each of the electrodes makes it possible to detect, upon deflecting, the secondary particles, and to control the range of azimuths of the secondary particles to be detected.

13 Claims, 5 Drawing Sheets

(51) Int. Cl.
  *H01J 37/10* (2006.01)
  *H01J 37/21* (2006.01)
  *H01J 37/28* (2006.01)
(52) U.S. Cl.
  CPC ....... *H01J 37/28* (2013.01); *H01J 2237/2448* (2013.01); *H01J 2237/2449* (2013.01); *H01J 2237/2806* (2013.01); *H01J 2237/2809* (2013.01); *H01J 2237/2817* (2013.01)
(58) Field of Classification Search
  CPC ...... H01J 37/222; H01J 37/224; H01J 37/244; H01J 37/26; H01J 37/261
  USPC .................................. 250/306, 307, 310, 311
  See application file for complete search history.

(56) References Cited

U.S. PATENT DOCUMENTS

| | | | | |
|---|---|---|---|---|
| 6,720,557 | B2* | 4/2004 | Frosien | H01J 37/244 |
| | | | | 250/306 |
| 2002/0148960 | A1* | 10/2002 | Todokoro | H01J 37/28 |
| | | | | 250/310 |
| 2005/0279937 | A1* | 12/2005 | Koike | B82Y 10/00 |
| | | | | 250/310 |
| 2005/0279938 | A1* | 12/2005 | Moses | H01J 37/20 |
| | | | | 250/311 |
| 2006/0186351 | A1 | 8/2006 | Nishiyama et al. | |
| 2008/0099673 | A1* | 5/2008 | Fukuda | H01J 37/244 |
| | | | | 250/307 |
| 2009/0184255 | A1 | 7/2009 | Fukada et al. | |
| 2009/0200463 | A1* | 8/2009 | Degenhardt | H01J 37/244 |
| | | | | 250/307 |
| 2013/0248705 | A1* | 9/2013 | Hayashi | H01J 37/02 |
| | | | | 250/307 |
| 2015/0014527 | A1 | 1/2015 | Otsuka | |
| 2015/0144785 | A1* | 5/2015 | Sears | H01J 37/1471 |
| | | | | 250/307 |
| 2016/0329188 | A1* | 11/2016 | Ominami | H01J 37/244 |

FOREIGN PATENT DOCUMENTS

| | | |
|---|---|---|
| JP | 2006-228999 A | 8/2006 |
| JP | 2012-23398 A | 2/2012 |
| JP | 2012-186177 A | 9/2012 |
| JP | 2014-225354 A | 12/2014 |

OTHER PUBLICATIONS

Japanese-language Written Opinion (PCT/ISA/237) issued in PCT Application No. PCT/JP2015/069372 dated Sep. 8, 2015 (four (4) pages).

* cited by examiner

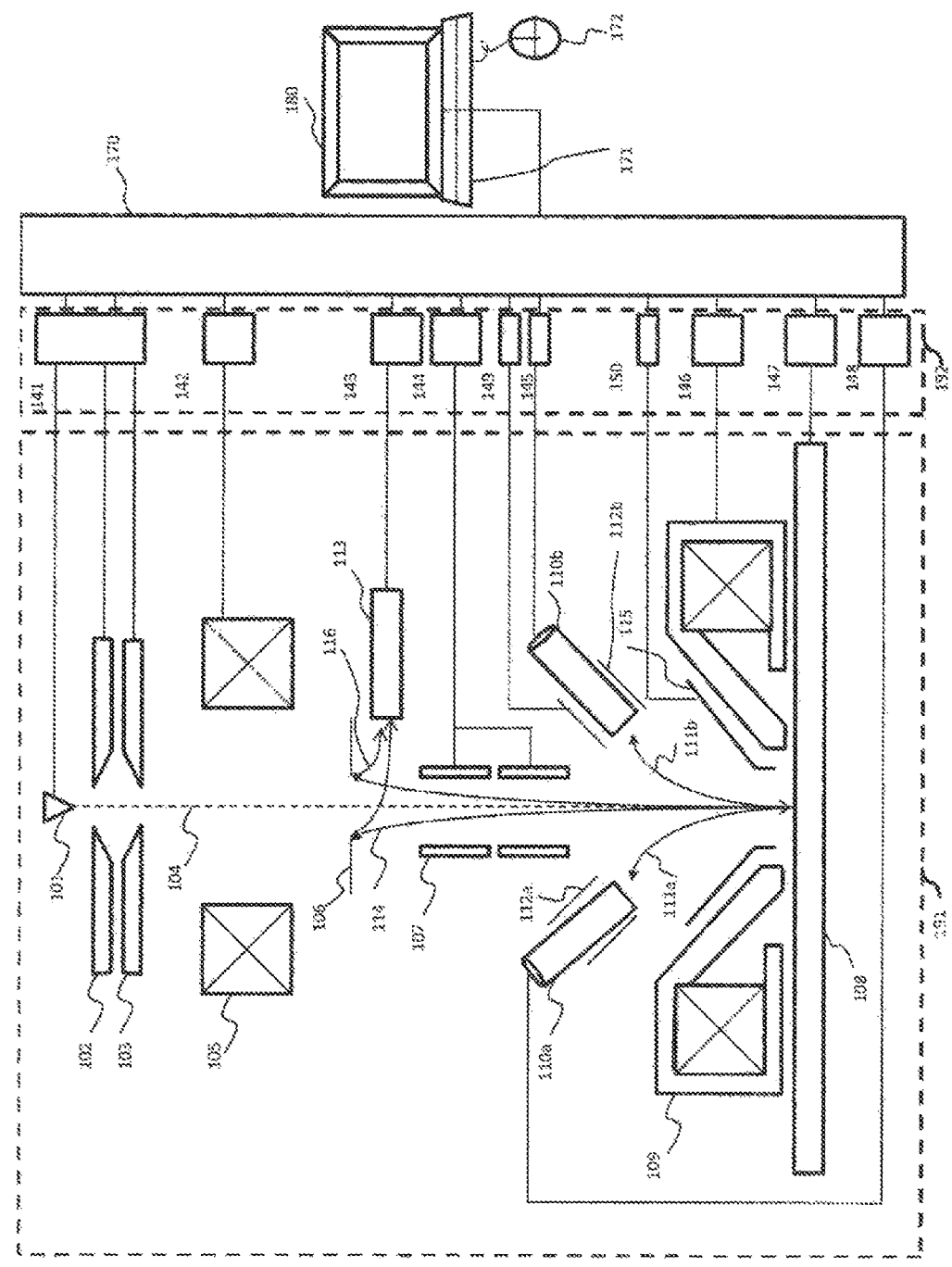
[Fig. 1]

[Fig. 2]
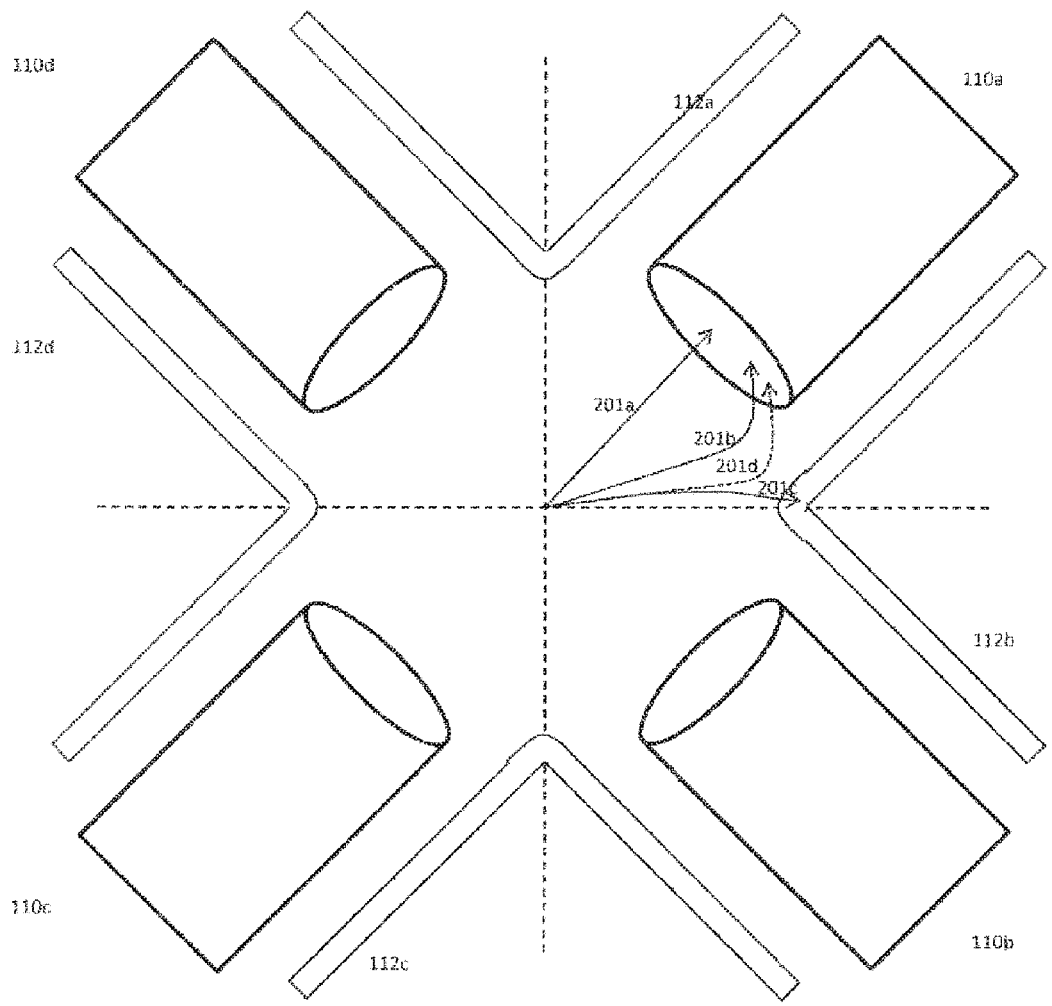

[Fig. 3A]
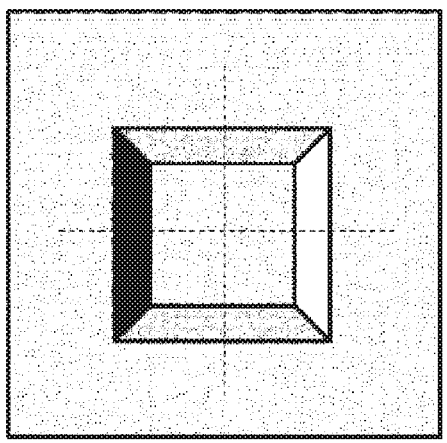
[Fig. 3B]
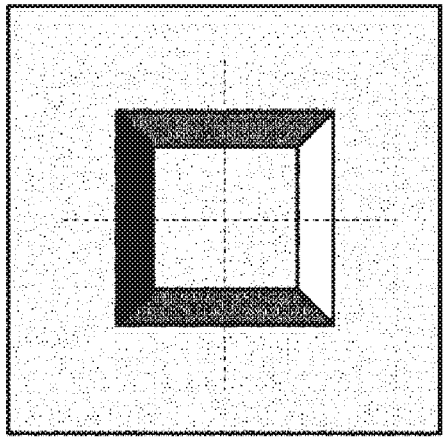
[Fig. 3C]
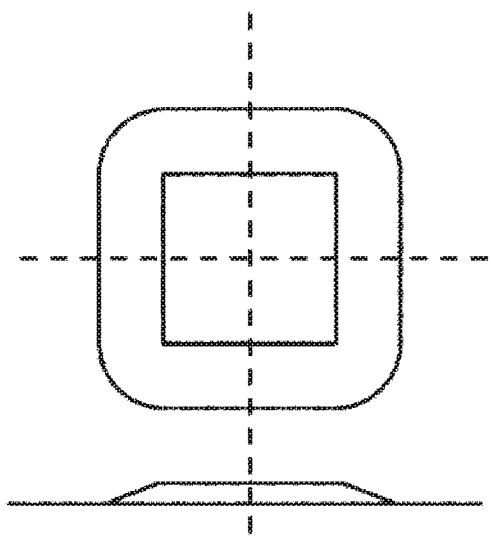

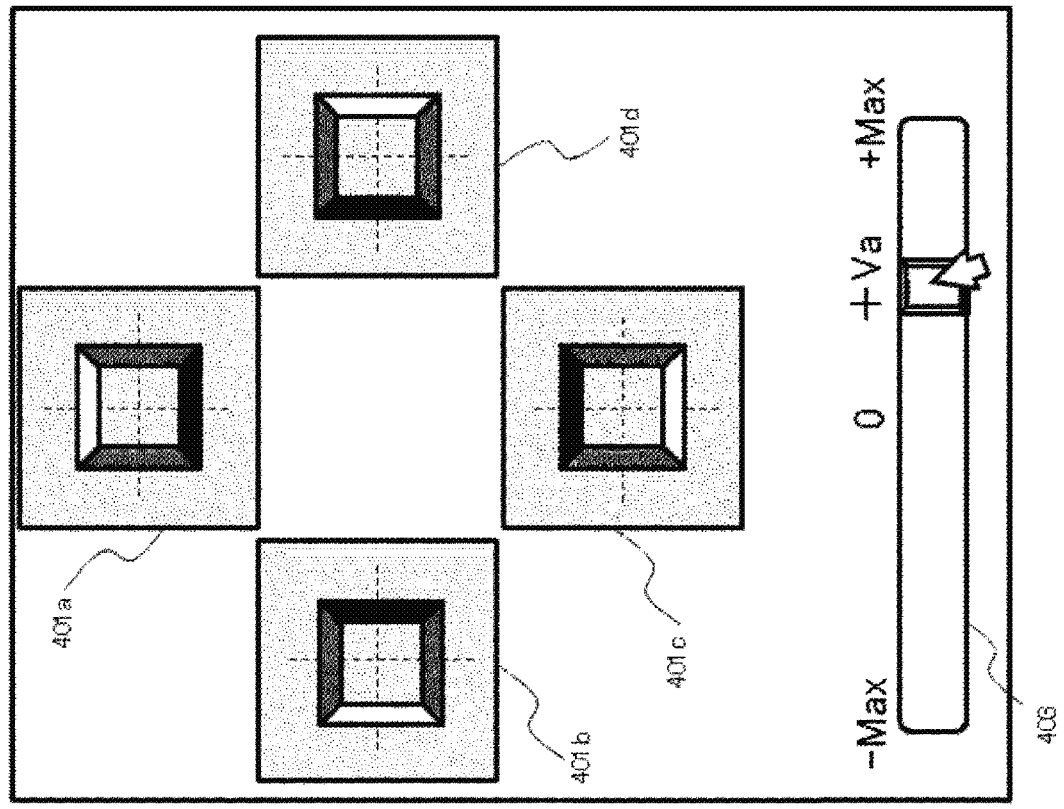
[Fig. 4A]
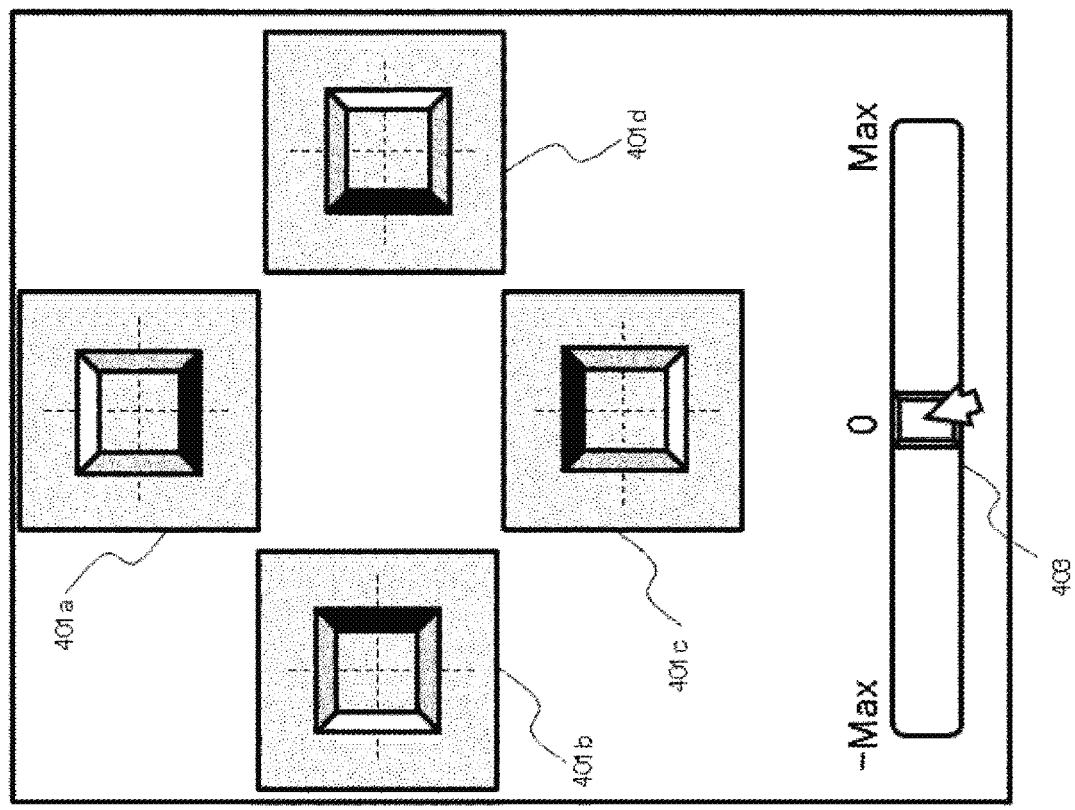
[Fig. 4B]

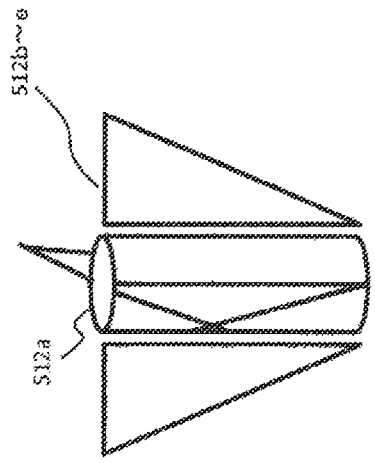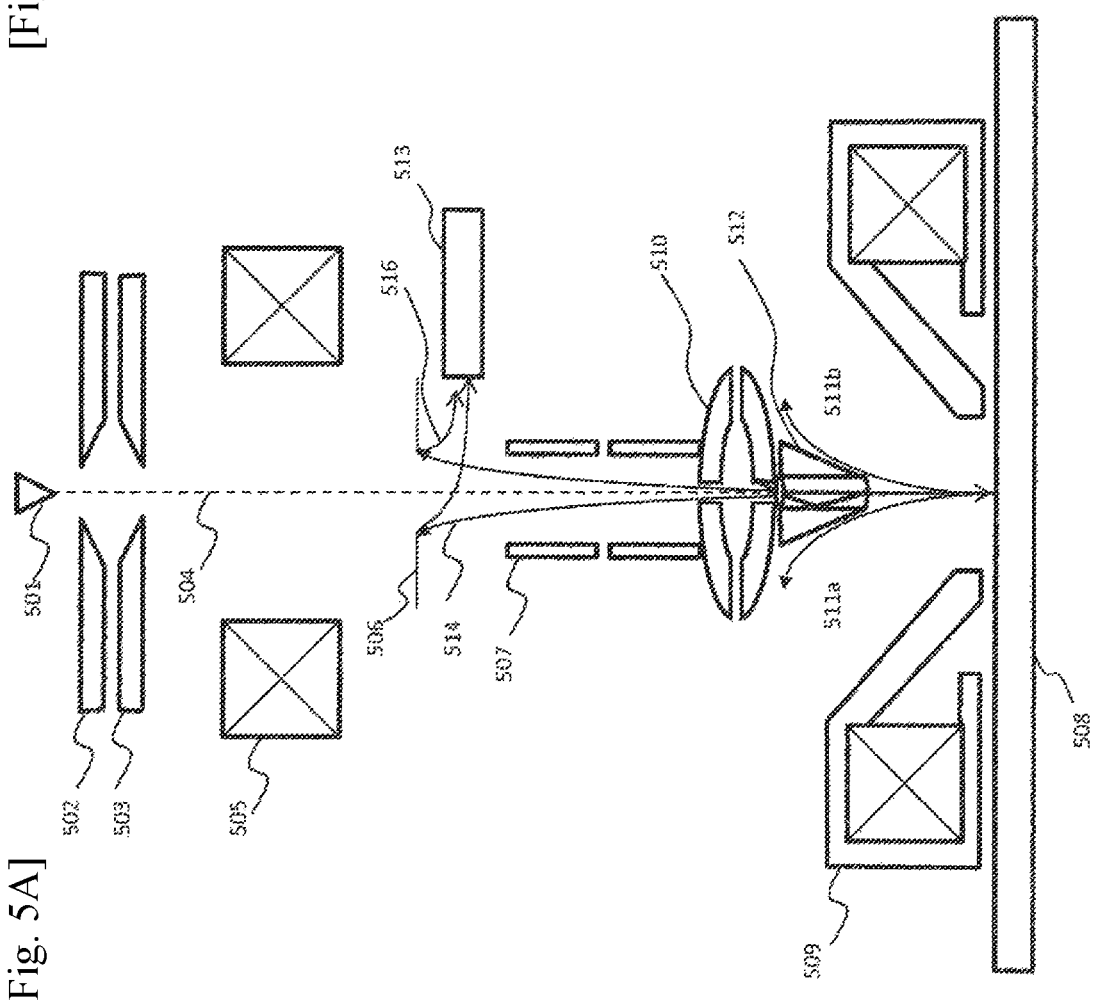

CHARGED PARTICLE BEAM DEVICE

TECHNICAL FIELD

The present invention relates to a scanning electron microscope, a charged particle detection system of a charged particle beam device, and a charged particle beam device equipped with a charged particle detection system, and particularly to a scanning electron microscope for forming an image with a signal of an electron such as a secondary electron generated from a sample by scanning an electron beam. Specifically, the present invention relates to a scanning electron microscope that discriminates irregularities of a sample by detecting a secondary particle generated from the sample and more particularly to a review SEM technology that reviews measurement and defects of patterns formed on a substrate such as a semiconductor.

BACKGROUND ART

A semiconductor device is manufactured by repeating a process of transferring a pattern formed by a photomask on a wafer by a lithography process and an etching process. In such a manufacturing process, so as to realize an early launch of yield and stable operation of the manufacturing process, it is essential to quickly analyze defects found by in-line wafer inspection and use the analyzed defects to countermeasure thereabout.

In the in-line wafer inspection, it is common to re-detect defects and foreign matters detected by an optical defect inspection device with a review device disposed at a rear stage of the defect inspection device and to observe the re-detected defects and foreign matters in detail. So as to quickly link inspection results to countermeasures against failure, in particular, automatic defect review and classification technology is key which reviews a large number of detection defects at high speed and classifies the large number of detection defects according to cause of generation. Since the defect size affecting the manufacturing yield of semiconductors has also been miniaturized according to the miniaturization of a semiconductor pattern manufacturing process, reviewing with high resolution is becoming difficult with the optical review device. Therefore, scanning electron microscope (SEM) type review device capable of high-speed and high-resolution review can be commercialized. In this device, it is important to acquire an SEM image (hereinafter also referred to as a shadow image) equivalent to a shadow generated when light is applied from the side so as to detect minute foreign matters and irregularities such as scratches.

Hereinafter, regarding an emission direction of secondary electrons (SE) and backscattered electrons (BSE) (hereinafter collectively referred to as secondary particles) generated by scanning a charged particle beam to a sample, a direction from 0 degrees to 90 degrees from a sample surface toward a normal line of the sample is defined as an elevation angle and a rotation angle around the normal line of the sample is defined as an azimuth.

The basic principle for acquiring such a shadow image will be explained. As an example, a case of a foreign matter having a trapezoidal shape whose an upper side is shorter than a lower side is considered. Irregularities of the trapezoidal shape are scanned with electron beams from an upper side of a cross section thereof. In a case where a right side of the irregularities is irradiated with the electron beam, secondary electrons are emitted. At this time, when attention is paid to a low angle component of the elevation angle of the secondary electron, a portion of the secondary electron emitted to the left side is shielded by the irregularities. Therefore, when two left and right detectors are disposed on the foreign matter side to detect secondary electrons, the numbers of secondary electrons detected by the left and right detectors is different from each other. In other words, the electrons emitted from the right side of the foreign matter are detected more frequently by the detector on the right side than the detector on the left side. In this case, a brightness on the right side of the foreign matter in the SEM image generated by the detector on the right side is brighter than the same position in the SEM image generated by the detector on the left side. When the left side of the foreign matter is irradiated with the electron beam, the state opposite to the above description is obtained. Therefore, the SEM image obtained by the detector described above becomes an SEM image in which the right side of the foreign matter is bright in the detector on the right side and an SEM image in which the left side of the foreign matter is bright in the detector on the left side, and thus becomes an image with the enhanced shadow.

On the other hand, a case of a trapezoidal recess whose upper side is longer than the lower side is considered. In a case where the right side of the recess is irradiated with the electron beam, secondary electrons are emitted. At this time, a portion of the secondary electrons emitted to the right side is shielded by a side surface of the recess. As a result, the electrons emitted from the right side of the recess are detected more frequently by the detector on the left side than the detector on the right side. In this case, the brightness on the right side of the recess in the SEM image generated by the detector on the right side is darker than the same position in the SEM image generated by the detector on the left side. The left side of the recess is irradiated with the electron beam, a state opposite to the above description is obtained. Therefore, the SEM image obtained by the detector described above becomes an SEM image in which the right side of the recess is dark in the right side detector and an SEM image in which the left side of the recess is dark in the left side detector.

The shape of a foreign matter or the like from the acquired SEM image can be discriminated using the principle described above. Furthermore, so as to detect shallow irregularities, fine foreign matter, or the like with high sensitivity, it is important that shadow contrast is emphasized by selecting the detected azimuth and the detected elevation angle for electrons emitted from foreign matter or the like and high quality image is acquired. PTL 1 discloses that "a low angle component and a high angle component of an elevation angle viewed from the point of occurrence of secondary electrons are selected and an azimuth component is also selected and detected" by "applying an electric field that accelerates secondary particles adjacent to a wafer so as to suppress secondary particle energy dependency of rotation of the secondary particle".

CITATION LIST

Patent Literature

PTL 1: JP-A-2006-228999 (US-A-2006-0186351)

SUMMARY OF INVENTION

Technical Problem

In a case where an objective lens is a lens using a magnetic field, secondary particles pass while spirally rotating by receiving the Lorentz force in the magnetic field of the objective lens. Here, the secondary particles are emitted over all directions of elevation angle and azimuth from the sample. In addition, the energy at the time of emission spreads from 0 eV to the sample irradiation energy of the primary electron beam. Therefore, an emission angle at the time of emission and a rotation angle at the time of passing through the objective lens depending on the emission energy vary.

In PTL 1, energy dependency is suppressed by accelerating secondary particles when passing through the objective lens by applying an electric field of $10^5$ V/m or more in the magnetic field of the objective lens adjacent to the wafer. As a result, it is described that detection is performed with a detector while keeping azimuth information. However, in a case where secondary particles spread through the objective lens are detected, secondary particles flying between the detector and the detector cannot be detected. In PTL 1, there is no description regarding detectors of secondary particles flying between detectors, and detection of secondary particles flying between detectors cannot be performed as it is.

In addition, the electric field within the objective lens magnetic field also accelerates the primary electron beam which scans over the sample. Therefore, with only the electric field within the objective lens magnetic field, it is not possible to independently control the energy dependence suppression and the optimum condition of the primary electron beam for keeping information of the azimuth direction.

An object of the present invention is to improve the S/N ratio of the shadow image or emphasize the shadow contrast and thus to acquire the high quality of image by controlling an orbit of the azimuth component of the secondary particle which spreads through the objective lens by a method independent from the control of the primary electron beam.

Solution to Problem

So as to solve the problem described above, in the present invention, electrodes are disposed around a detector that acquires a shadow image of irregularities or between detectors. By detecting secondary particles flying between the detectors by bending the secondary particles in a direction of the detector, or by not detecting the electrons flying in the direction of the detector when a voltage is applied to these electrodes, an azimuth range that can detect by the detector among the secondary particles generated from the sample is controlled.

More specifically, the present invention includes a charged particle source that generates a primary charged particle beam; an objective lens that focuses the primary charged particle beam on a sample; a plurality of detectors that are disposed closer to a side of the charged particle source than the objective lens, are disposed symmetrically around an optical axis of the primary charged particle beam, and detect secondary particles obtained by irradiating the sample with the primary charged particle beam; an electrode that forms an electric field in a direction corresponding to each of the plurality of detectors between travel routes of secondary particles from the sample to the detectors; and a control power supply that applies a voltage to the electrode.

Advantageous Effects of Invention

According to the present invention, the orbit of the azimuth component of the secondary particle can be controlled by spreading through the objective lens without depending on the control of the primary electron beam. As a result, it is possible to improve an S/N ratio of a shadow image or emphasize shadow contrast so as to obtain high-quality images. As a result, it is possible to acquire an image with emphasized shadow contrast, and it is possible to detect shallow irregularities, fine foreign matter or the like with high sensitivity. In addition, defects can be detected, reviewed, and classified with high sensitivity and the cause of the defect can be easily specified. In addition, by improving the S/N ratio of the shadow image, it is possible to acquire a high S/N shadow image in a short time. Accordingly, it is possible to increase the number of defects that can be detected per hour, and it is possible to increase the throughput of the review SEM.

The problems, configurations, and effects other than those described above will be clarified from the description of the embodiments below.

BRIEF DESCRIPTION OF DRAWINGS

FIG. 1 is a schematic overall configuration diagram of a device according to Example 1.

FIG. 2 is a diagram illustrating principle of secondary particle azimuth discrimination according to Example 1.

FIGS. 3A to 3C are diagrams illustrating an example of an image acquired according to Example 1.

FIGS. 4A and 4B are diagrams illustrating an example of a user interface when changing a voltage to be applied to an electrode in Example 1.

FIGS. 5A and 5B are schematic overall configuration diagrams of a device according to Example 2.

Hereinafter, although an example using a scanning electron microscope will be described as an example of a charged particle beam device, this is merely one example of the present invention and the present invention is not limited to the embodiments to be described below. In the present invention, the charged particle beam device broadly includes a device for capturing an image of a sample using a charged particle beam. As an example of a charged particle beam device, an inspection device, a review device, and a pattern measurement device using the scanning electron microscope can be exemplified. In addition, it is also applicable to general-purpose scanning electron microscopes, and sample processing devices and sample analysis devices equipped with the scanning electron microscope. In addition, in the following description, the charged particle beam device also includes a system in which the charged particle beam device described above are connected via a network and a composite apparatus of the charged particle beam device described above.

In the present specification, the term "defect" is not limited to a defect of a pattern but broadly includes an observation object such as foreign matter, pattern size abnormality, and structural defect.

In this specification, a "defect image" is an image (inspected image) to be a target of a defect inspection and includes not only an image of a true defect but also an image of a defect candidate and an image of a pseudo defect. In addition, "reference image" is an image used for comparison with a defect image for defect extraction and is an image of a normal area, that is, an area estimated to be free from defects.

In the present specification, "secondary electron (SE)" is an electron having an energy of 50 eV or less among electrons emitted from a sample by irradiation with primary electrons.

In the present specification, "backscattered electrons (BSE)" is electrons having an energy of 50 eV or more among electrons emitted from a sample by irradiation with primary electrons.

Example 1

FIG. 1 is a schematic diagram of the overall configuration of a device of Example 1 to which the present invention is applied. The device of this example includes a vacuum container 191, a power supply system 192, a control device 170, and an image display device 180.

The vacuum container 191 is configured of an electron optical lens barrel including an electron source, a primary electron deflection system, and a secondary particle detection system; and a sample chamber in which the sample 108 is stored. The control device 170 includes a keyboard 171 and a mouse 172 which are input interfaces. The input interface includes a wide range of other input devices. The electron source is configured of a cathode 101, a first anode 102, and a second anode 103, and generates a primary electron beam. The primary electron deflection system is configured of a focusing lens 105, a deflector 107, and an objective lens 109. The sample chamber includes a stage on which the sample 108 is placed and which is movable in the sample chamber. The secondary particle detection system is configured of an axisymmetric detector 110a, an axisymmetric detector 110b, an electrode 112a, an electrode 112b, and a detector 113. Since FIG. 1 is a side sectional view, although the electrodes 112a and 112b are indicated by two lines, respectively, actually the electrodes have a cylindrical shape, a conical shape, or a shape that forms a portion of the cylindrical shape and the conical shape. The electrodes have a structure for covering at least a portion which includes the detection surface of the detector by the cylindrical shape or the conical shape. The shapes of the electrodes 112a and 112b are not limited thereto. In addition to this, other lenses, electrodes, and detectors may be included in the electron optical lens barrel, or a portion thereof may be different from the above, and the configuration of the electron optical lens barrel is not limited thereto.

An extraction voltage is applied between the cathode 101 and the first anode 102 by the high voltage control power supply 141 and the primary electron beam 104 is pulled out. Since an acceleration voltage is applied between the first anode 102 and the second anode 103 by the high voltage control power supply 141, the primary electron beam 104 is accelerated and proceeds to the primary electron deflection system at the subsequent stage. The primary electron beam 104 is focused by a focusing lens 105 controlled by a focusing lens control power supply 142. The primary electron beam 104 is focused as a minute spot on the sample 108 by the objective lens 109 controlled by an objective lens control power supply 146. The minute spot of the primary electron beam 104 is two-dimensionally scanned on the sample by a deflector 107 controlled by a deflector control power supply 144. In this example, the deflector 107 for scanning the primary electron beam on the sample is formed in two stages so that the deflection center of the primary electron beam at the time of scanning passes through the lens center of the objective lens. The deflector 107 may be either a magnetic field type deflector or an electrostatic type deflector.

The acceleration electrode 115 is controlled by the electrode power supply 150, and a positive voltage for accelerating the primary electron beam in the objective lens is applied thereto. By applying a negative voltage from the sample application voltage control power supply 147 to the sample 108, the primary electron beam is decelerated to a desired energy after leaving the objective lens. With these voltages, since the primary electron beam passes through the objective lens at a high speed while keeping the landing energy to the sample at a low acceleration, high resolution can be achieved.

An axisymmetric detector 110a, an axisymmetric detector 110b, and a detector 113 are disposed closer to the side of the cathode 101 than the sample 108. The plurality of axisymmetric detectors are disposed symmetrically around the optical axis of the primary electron beam. The axisymmetric detectors 110a and 110b are located closer to the side of the sample 108 than the detector 113 and are disposed closer to the cathode 101 than the objective lens. A cylindrical electrode 112a and an electrode 112b are disposed around the axisymmetric detector 110a and the axisymmetric detector 110b. More specifically, the electrodes 112a and 112b are disposed so as to form an electric field between travel routes of secondary particles from the sample 108 to the axisymmetric detector 110. A voltage can be applied to the electrodes 112a and 112b by the electrode voltage control power supply 149.

The secondary particles 111a, 111b, and 114 are electrons emitted from the sample 108 by the irradiation of the primary electron beam 104. By the negative voltage applied to the sample 108 and the positive voltage applied to the acceleration electrode 115, the secondary particles are accelerated toward the cathode 101 and pass through the objective lens. When the secondary particles pass through the objective lens, the secondary particles generally receive a Lorentz force due to the magnetic field of the objective lens and receive a rotation action in the azimuth direction. As the secondary particles are accelerated, since the rotation angle in the azimuth direction becomes small when the secondary particles pass through the objective lens, the rotation angle is detected by the secondary particle detection system while keeping the azimuth information.

The secondary particles 114 are electrons with small emission elevation angle or electrons with low energy among the electrons emitted from the sample. The spread of the secondary particles 114 in the radial direction becomes relatively small when pulled up from the sample 108 to the cathode 101 side. As a result, the secondary particles 114 are pulled upward and collide with a reflection plate 106 disposed closer to the side of the cathode 101 than the deflector 107. By the collision of the secondary particles 114, secondary electrons 116 are newly generated from the reflection plate. The newly generated secondary electrons 116 are detected by a detector 113 disposed closer to the sample 108 side than the reflection plate 106.

Instead of the detector 113 for detecting secondary particles via the reflection plate 106, it may be a detection system that directly detects secondary particles by grounding a microchannel plate, a semiconductor detector or a scintillator.

The secondary particles 111a and 111b are electrons having a large emission elevation angle and large energy among the electrons emitted from the sample. These secondary particles 111a and 111b are electrons having a relatively large spread in the radial direction when pulled up from the sample 108 to the cathode 101 side. Electrons with large energy include backscattered electrons in particular. Since the secondary particles 111a and 111b spread relatively wider than the secondary particles 114, the secondary particles 111a and 111b are detected by the axisymmetric detector 110a and the axisymmetric detector 110b before being pulled up to the reflection plate 106. The axisymmetric detector 110a and the axisymmetric detector 110b are disposed in an axisymmetric manner in a plane shape which is perpendicular to the axis of the primary electron beam 104.

In the axisymmetric detector 110a and the axisymmetric detector 110b, a shadow image is obtained in which the contrast is emphasized in one direction thereof. As described in Background Art, since two left and right detectors are disposed on the upper side of the foreign matter, the secondary particles emitted along the side wall from the side wall of the sample and the numbers of secondary particles detected by the left and right detectors are different from each other.

However, since the secondary particles emitted from the sample spread in all directions in the azimuth direction, some secondary particles flying between the axisymmetric detector 110a and the axisymmetric detector 110b cannot be detected. By applying a voltage to the electrode 112a and the electrode 112b by the electrode voltage control power supply 149, it is possible to form an electric field that corresponds one-to-one to the axisymmetric detector. This electric field is an electric field acting in the direction of the azimuth of the secondary particles generated from the sample, and deflects the secondary particles flying between the axisymmetric detectors in the direction of the detection surface of the axisymmetric detector. As a result, this electric field makes it possible to detect secondary particles flying between the axisymmetric detectors and the S/N ratio of the shadow image obtained by the axisymmetric detector is improved. This makes it possible to acquire a high S/N shadow image in a short time of image acquisition time. By shortening the image acquisition time, it is possible to increase the number of defects that can be detected per hour, and it is possible to increase the throughput of the review SEM.

In addition, two or more such as four axisymmetric detectors 110a and axisymmetric detectors 110b disposed axisymmetrically may be provided. In a case where two or more electrodes are disposed, the electrodes corresponding to the electrodes 112a and 112b may be provided in the same number as the axisymmetric detectors. In a case where the number is not the same, it may be installed in a detector in a certain direction (for example, left and right direction) on which the object is disposed to be disposed. In addition, at this time, the electrodes corresponding to the electrodes 112a and 112b can adjust and control the voltages to be individually applied by the electrode voltage control power supply 149. In a case where all the same voltage is applied, the electrodes corresponding to the electrode 112a and the electrode 112b may be installed as an electrode having an integrated structure. In this case, the electrode surfaces which influence the orbits of the secondary particles 111a and 111b have a cylindrical shape, a conical shape, or a shape that forms a portion of the cylindrical shape and the conical shape.

The signals detected by the axisymmetric detectors 110a and 110b and the detector 113 are amplified by amplifiers 148, 145 and 143, respectively. The detection signal amplified by each amplifier is processed by the control device 170 in synchronization with the scanning of the primary electron beam 104 to generate a two-dimensional image. The generated two-dimensional image is displayed as a sample image on the image display device 180.

In addition, the control device 170 can detect defects and also automatically classify the types of detected defects based on images. In addition to the control described above, the control device 170 controls the operation or state of each portion constituting the device.

In addition, each function of the control device 170 can be realized by either hardware or software. In a case of being configured of hardware, it can be realized by integrating a plurality of computing units for executing processes on a wiring substrate, or in a semiconductor chip or a package. In a case of being configured of software, it can be realized that a program for executing a desired computing operation is executed by a central processing unit (CPU) mounted on a device constituting the system or a general-purpose CPU mounted on a general-purpose computer connected to the system. It is also possible to upgrade an existing device using the recording medium in which this program is recorded.

The device configuration of this example is not limited thereto and a portion of the device may be a separate and independent device.

FIG. 2 is a sectional view of the vicinity of the axisymmetric detectors, as viewed from the direction of the cathode 101, on which four axisymmetric detectors in FIG. 1 are disposed. The axisymmetric detectors 110a, 110b, 110c, and 110d are equally disposed for each 90 degrees in the azimuth direction.

Electrodes 112a, 112b, 112c, and 112d having the same shape and having the function of discriminating the angle of the secondary particles in the azimuth direction are disposed for each 90 degrees between the adjacent axisymmetric detectors. An electrode 112b is disposed between the axisymmetric detectors 110a and 110b, an electrode 112c is disposed between the axisymmetric detectors 110b and 110c, and an electrode 112d is disposed between the axisymmetric detectors 110c and 110d, and an electrode 112a is disposed between the axisymmetric detectors 110d and 110a.

The voltages individually applied by the electrode voltage control power supply can be adjusted and controlled to the electrodes 112a, 112b, 112c, and 112d. The electrode voltage control power supply may be provided so as to correspond to each electrode. By applying a voltage to the electrode, it acts on the orbit in the azimuth direction of the secondary particles to form an electric field that corresponds one-to-one to the axisymmetric detector. Here, "the electric field corresponding one-to-one to the axisymmetric detector" means, for example, a direction of an electric field vector corresponds to a direction of a principal axis of the detection surface of each axisymmetric detector or a direction (dot line direction in FIG. 2) of the midpoint of the adjacent axisymmetric detectors. In the example of FIG. 2, an electric field is formed so that the electric field vectors face four directions within the paper surface. In other words, "an electric field corresponding one-to-one to the axisymmetric detector" means an electric field in a direction corresponding to each of the plurality of axisymmetric detectors. In a case where all the same voltage is applied to the electrodes, the electrodes 112a, 112b, 112c, and 112d may be installed as an electrode having an integrated structure. In this case, the electrode surfaces which influence the orbits of the secondary particles have a cylindrical shape, a conical shape, or a shape that forms a portion of the cylindrical shape and the conical shape.

In the example of FIG. 2, ideally secondary particles generated from within each quadrant delimited by a dotted line are desirably detected by detectors within the same quadrant. In addition, since the secondary particle beam is subjected to a rotational action in the azimuth direction by the magnetic field of the objective lens, it is also desirable that all secondary particles generated from within one quadrant are detected within another quadrant. For example, the secondary particle beams to be detected by the detector of 110a are the secondary particle beams 201a, 201b, and 201c. Since the secondary particle beam accelerates and passes through the objective lens, azimuth information is in a state of being kept. The secondary particle beam 201a is secondary particles emitted in the azimuth direction toward the detector 110a. The secondary particle beams 201c are secondary particles emitted in an azimuth direction directed between the detector 110a and the detector 110b. In addition, the secondary particle beams 201b are secondary particles emitted in a direction of the azimuth between the secondary particle beams 201a and the secondary particle beams 201c.

In a case where the axisymmetric detector is disposed between the objective lens 109 and the deflector 107 as illustrated in FIG. 1, it is possible to detect secondary particles having a relatively large emission elevation angle and a large energy. Although not indicated in the drawings, a voltage of +5 kV for attracting the particle beam is applied to the detection surfaces of the axisymmetric detectors 110a, 110b, 110c, and 110d. The voltage applied to the detector surface is determined based on the condition that the light emission of the scintillator on the detector surface is optimal.

Due to the electric field applied to the detector surface, the secondary particle beam 201b is detected by bending the orbit in the direction of the detector 110a. On the other hand, since the secondary particle beam 201c is emitted in a direction away from the detection surface of the axisymmetric detector 110a than the secondary particle beam 201b, it is unlikely to be affected by the electric field applied to the detector surface. Therefore, in a case where the electrode 112b is not provided, the secondary particle beam flies between the detectors 110a and 110b without being detected by the detector 110a.

Here, in this example, by applying a negative voltage to repel secondary particles to the electrode 112b, an electric field acting on the orbit of the secondary particle in the azimuth direction is generated. By this electric field, the secondary particle beams 201c can be detected by the detector 110a by bending the orbit in the direction of the detector 110a as indicated by the dotted line of 201d. As a result, it is possible to widen the azimuth range in which secondary particles can be detected. Even between the axisymmetric detector and the electrode other than between the axisymmetric detector 110a and the electrode 112b, the effect of orbital change with respect to the secondary particle in the azimuth direction and spreading of the azimuth range capable of detecting the secondary particle can be obtained. Thus, the S/N ratio of the shadow image obtained from the detector is improved.

Next, the voltage applied to the electrodes will be described. The voltage applied to the electrode is more than the sum of an absolute value of the negative voltage applied to the sample and an absolute value of the voltage (landing energy) when the sample is irradiated with the primary electron beam. Consider, for example, when the negative voltage applied to the sample is 1 kV and the voltage when the sample is irradiated with primary electrons is 1 kV. At this time, the secondary particles generated from the sample have an energy width from 1 keV to 2 keV and fly to the detector and the electrode. At this time, by applying a negative voltage of −2 kV or more to the electrode, all the secondary particles flying between the detectors can be deflected in a direction of the axisymmetric detector.

In addition, in a case where the axisymmetric detectors 110a to 110d are semiconductor detectors, there is no application of voltage for attracting particle beam to the detection surface. Even in such a case, the particle beam flying in the direction of 201b can bend the orbit in the direction of the detector 110a by applying a voltage to the electrode 112a, and it can be detected by the detector 110a. Thus, it is also possible to control the range of the azimuth detected by the detectors 110a to 110d by controlling the voltage applied to the electrodes 112a to 112d.

In addition, a case where a voltage (positive voltage) for attracting secondary particles is applied to the electrodes 112a to 112d is considered. At this time, a portion of the secondary particles flying in the direction of the axisymmetric detectors 110a to 110d cannot be detected by the axisymmetric detectors 110a to 110d by bending the orbit in the direction of the electrodes 112a to 112d. As a result, the azimuth range of the detectable secondary particles becomes narrow, and a shadow image in which the contrast of the shadow is emphasized in a specific direction can be obtained. By limiting the azimuth component of the secondary particles detected by the detector, it is possible to detect shallow irregularities, fine foreign matter, or the like, which is unlikely to be discriminated with high sensitivity in a case where the azimuth component is not limited.

FIG. 3 is a diagram illustrating an example of a shadow image acquired when the azimuth range of secondary particles emitted from a sample is controlled with respect to the shadow image generated by the axisymmetric detector and sample shape thereof.

FIG. 3(a) illustrates an example of an image in a case where the azimuth range of the secondary particle detected by the axisymmetric detector is wide, and FIG. 3(b) is an example of the image in a case where the azimuth range is narrow. FIG. 3(c) is a top view and a sectional view of the sample shape projected on these images. The top view is a pattern in which different squares overlap each other and the centers of the respective squares are coincident to each other. The sectional view when the center of the top view is cut in the transverse direction is a trapezoidal shape whose upper side is shorter than the lower side. Although not indicated in the drawing, the sectional view when the center of the top view is cut in the vertical direction is also a trapezoidal shape whose upper side is shorter than the lower side.

FIG. 3(a) and FIG. 3(b) are shadow images which are generated by the axisymmetric detector capable of detecting secondary particles emitted in the right direction among the secondary particles generated when the sample shape illustrated in FIG. 3(c) is two-dimensionally scanned with the primary electron beam. Focusing on the elevation angle component of the secondary particles, the secondary particles generated by irradiating the primary electron beam on the left side of the sample, a portion of the secondary particles emitted to the right side is shielded by the irregularities on the left side surface. Therefore, since the amount of signal in the axisymmetric detector decreases, the left side surface is displayed darker in the shadow image. On the other hand, among the secondary particles generated when the right side is irradiated with the primary electron beam, since the secondary particles emitted to the right side are detected by the axisymmetric detector without being shielded, relative signal amount increases. As a result, in the shadow image, the right side is displayed brighter. In addition, among the secondary particles generated when the upper side surface or the lower side surface is irradiated with the primary electron beam, a portion of the secondary particle emitted to the right side is shielded by the wall surface, in the image, it is displayed as the brightness between the left side surface and the right side surface.

Since, in a case of FIG. 3(a) where the detection azimuth range of the secondary particle is wide, a portion of the secondary particles emitted upward and downward can also be detected, the upper and lower slopes are bright, compared to the image of FIG. 3(b). As a result, since the detection azimuth range of the image in FIG. 3(a) is wide, the secondary particles that can be detected increase, and the image has a high S/N of the shadow image, compared to FIG. 3(b).

On the other hand, since the detection azimuth range of the image in FIG. 3(b) is narrow, the rate at which secondary particles emitted upward and downward are detected by the detector is small, so that the brightness of the upper and lower slopes becomes darker, compared to FIG. 3(a). As a result, the image of FIG. 3(b) becomes a shadow image in which the contrast of only the right side face is emphasized, and it is possible to accurately obtain the irregularities information such as a foreign matter, compared to the image of FIG. 3(a). As a result, it is possible to detect shallow irregularities, fine foreign matter and the like with high sensitivity.

FIG. 4(a) and FIG. 4(b) are examples of display screens of the image display device 180 when adjusting or setting the voltage applied to the electrodes 112a, 112b, 112c, and 112d in Example 2. The display screen has at least sample image display portions 401a, 401b, 401c, and 401d and an applied voltage adjustment portion 403. On the sample image display portions 401a, 401b, 401c, and 401d, sample images constituted by signals from the respective detectors are displayed in real time. Further, each sample image is displayed in correspondence to each detector which detects the signal used for generating the respective image. In addition, although an example of a display screen of the image display device 180 described below is an example in which four axisymmetric detectors are grounded as illustrated in FIG. 2, the number and disposition of the detectors are not limited thereto and in other example, it can be used when controlling the applied voltage to the electrodes used for azimuth control in another example.

FIG. 4(a) is an example of a display screen of the image display device 180 in a state where no voltage is applied to the electrodes 112a to 112d used for azimuth control. Shadow image output from the four axisymmetric detectors 110a to 110d is displayed on the shadow image output position 401a, 401b, 401c, and 401d up and down, left and right of the screen of the image display device 180. Shadow image generated from axisymmetric detector for detecting secondary particles emitted on the upper side thereof is displayed on the shadow image output position 401a located above in the screen. Similarly, shadow image generated from axisymmetric detector for detecting secondary particles emitted on the left is displayed on the shadow image output position 401b on the left side in the screen. Shadow image generated from axisymmetric detector for detecting secondary particles emitted on the lower side, is displayed on the shadow image output position 401c located below in the screen. The shadow image generated from the axisymmetric detector for detecting the secondary particles emitted to the right side is displayed at the shadow image output position 401d located on the right side in the screen.

On the screen of the image display device 180, in addition to the shadow image output position, an applied voltage adjustment portion 403 is also displayed. The applied voltage adjustment portion 403 adjusts the voltages to be applied to the electrodes 112a, 112b, 112c, and 112d, and the magnitude of the voltage is set according to the instruction input by the user using the input interface such as the mouse 172. The applied voltage adjustment portion 403 is, for example, a slider bar.

In FIG. 4(a), the applied voltage adjustment portion 403 is in the intermediate position. At this time, no voltage is applied to the azimuth control electrode, and the applied voltage becomes a state of being 0 V. When the applied voltage adjustment portion 403 is moved to the right side of the intermediate position, a positive voltage (up to +MAX [V]) for drawing the secondary particles is applied to the azimuth control electrode. On the other hand, when the applied voltage adjustment portion 403 is moved to the left side of the intermediate position, a negative voltage (up to −MAX [V]) for repelling the secondary particles is applied to the azimuth control electrode.

FIG. 4(b) is a screen example of the image display device 180 when the applied voltage adjustment portion 403 is adjusted to apply +Va [V] to the azimuth control voltage. By applying a positive voltage to the electrodes, it is possible to limit the azimuth direction of the secondary particles detected is limited by the axisymmetric detector, and the shadow image to be displayed on the shaded image output positions 401a, 401b, 401c, and 401d becomes an image in which the contrast is further emphasized in one direction than that in FIG. 4(a). In this way, the device user moves the applied voltage adjustment portion 403 on the screen to check the shadow image obtained corresponding to the voltage applied to the electrodes in real time, and then can determine electrode voltage condition in which the visibility of the defect is the best.

In addition, as a screen example when applying a voltage to the electrode, a screen example in which fixed voltage is applied in advance is considered. In this case, by disposing buttons indicating the function of changing the appearance of the shadow image such as "electrode voltage OFF", "shadow contrast enhancement", "improvement of shadow image S/N" on the screen, the voltage applied to the electrode and the shadow image obtained at that time can be changed. In addition, a mode for obtaining a high S/N image by applying a positive voltage to the electrode and a mode for emphasizing the contrast by applying a negative voltage to the electrode can be provided in advance, and the user may select a necessary mode by a mode selection portion such as a switch displayed on the screen. The voltage applied to the electrode may include not only positive voltage and negative voltage but also 0 V.

Example 2

FIG. 5(a) is a schematic diagram of the device configuration of the second example to which the present invention is applied. In the example 2, instead of the axisymmetric detectors 110a and 110b and the electrodes 112a and 112b in FIG. 1, an annular detector 510 divided into four closer to the side of the cathode 501 than the sample 508 and the objective lens 509 is disposed. For example, the annular detector 510 is a detector using a microchannel plate, a semiconductor detector, or a scintillator. The number of divisions of the annular detector is not limited thereto. In addition, an electrode 512 for discriminating the azimuth of the secondary particles is disposed between the annular detector 510 and the objective lens 509. In addition, in FIG. 5, although the electrode corresponding to the acceleration electrode 115 in FIG. 1 is not disposed, it may be disposed similarly to FIG. 1. Since the other configuration is the same as that of Example 1, description of the same portions as those of Example 1 will be omitted.

As illustrated in FIG. 5(b), the electrode 512 for discriminating the azimuth of the secondary particle includes a cylindrical component 512a and plate-like electrodes 512b to 512e in the circumference of the cylindrical component 512a are disposed by being divided for each 90 degrees in an axisymmetric manner to be four portions in the circumferential direction of the cylindrical component 512a. The cylindrical component 512a is at the same potential as the second anode 503 which is the acceleration voltage of the primary electron beam so as not to affect the primary electron beam. The plate-like electrodes 512b to 512e are controlled to a potential which is different from that of the cylindrical portion by insulation from the cylindrical component 512a. In other words, it is possible to adjust and control individually applied voltages by four electrode voltage control power supplies. However, in a case where all the voltages applied to the plate-like electrodes 512b to 512e are made the same, the number of electrode voltage control power supply may be one.

By applying a voltage to the plate-like electrodes 512b to 512e, an electric field is formed which acts on the movement of the secondary particles 511 in the azimuth direction generated from the sample by the irradiation of the primary electron beam 504. In this example, since the acceleration electrode 115 for accelerating the secondary particles is not installed, as the secondary particles generated from the sample are attracted toward the cathode 501, the information in the azimuth direction is lost by the rotation action inside the objective lens. Therefore, as the electrode 512 is installed closer to the sample 508, the azimuth information can be detected by the annular detector 510 while keeping azimuth information. This is because the kinetic energy in the azimuth direction can be controlled before the information in the azimuth direction of the secondary particle 511 is lost. From the signal detected by the annular detector 510, the shadow image described with reference to FIG. 3 and FIG. 4, that is, the shadow image corresponding to the azimuth direction of the secondary particle and the divided azimuth direction of the annular detector 510 can be obtained.

Control of azimuth direction movement of secondary particles by plate-like electrodes 512b to 512e will be described. As an example, detection of secondary particles emitted to the right side among secondary particles generated from a sample will be considered. At this time, so as to obtain information on the sample while keeping the emission azimuth of the secondary particle, the secondary particle emitted to the right side needs to detect by one of the division portions of the annular detector 510 (referred to as division portion A). However, a portion of the secondary particle is also detected in the division portion adjacent to the division portion A due to the difference in the rotation angle in the objective lens caused by the difference between the energy of the secondary particle and the emission elevation angle. By applying a negative voltage to the plate-like electrodes 512b to 512e, the azimuth direction of the secondary particles flying to the adjacent division portion is controlled. As a result, all of the secondary particles emitted in a specific azimuth direction can be detected by one of the division portions of the annular detector 510. Accordingly, shadow contrast enhancement can be performed.

In addition, in a case where a negative voltage is applied to the plate-like electrodes 512b to 512e, secondary particles flying between the division portions of the annular detector 512 can be collected on the plate-like electrode and cannot be detected. Accordingly, it is possible to limit the azimuth component of the secondary particle detected by the annular detector, and it is possible to obtain the same effect as that described in Example 1 and Example 2.

REFERENCE SIGNS LIST

101 . . . cathode, 102 . . . first anode, 103 . . . second anode, 104 . . . primary electron beam, 105 . . . focusing lens, 106 . . . reflection plate, 107 . . . deflector, 108 . . . sample, 109 . . . objective lens, 110a, 110b, 110c, 110d . . . axisymmetric detector, 111a, 111b . . . secondary particle beam, 112a, 112b, 112c, 112d . . . electrode, 113 . . . detector, 114 . . . secondary particle beam, 115 . . . acceleration electrode, 141 . . . high voltage control power supply, 142 . . . focusing lens control power supply, 143 . . . amplifier, 144 . . . deflector control power supply, 145 . . . amplifier, 146 . . . objective lens control power supply, 147 sample application voltage control power supply, 148 . . . amplifier, 149 . . . electrode control power supply, 170 . . . control device, 180 . . . image display device, 191 vacuum container, 192 . . . power supply system, 201a, 201b, 201c, 201d . . . secondary particle beam, 401a, 401b, 401c, 401d . . . shadow image output position, 403 . . . applied voltage adjustment portion, 510 . . . annular detector, 512 . . . azimuth discrimination electrode

The invention claimed is:

1. A charged particle beam device comprising:
   a charged particle source that generates a primary charged particle beam;
   an objective lens that focuses the primary charged particle beam on a sample;
   four detectors that are disposed closer to a side of the charged particle source than the objective lens, are disposed symmetrically around an optical axis of the primary charged particle beam, and detect secondary particles emitted by irradiating the sample with the primary charged particle beam;
   an electrode, including four electrodes arranged in a circumferential direction around the optical axis of the primary charged particle beam, that forms an electric field in a direction corresponding to each of the four detectors between travel routes of secondary particles from the sample to the four detectors;
   one or more control power supplies that apply a same voltage to each of the four electrodes or apply different voltages to each of the four electrodes;
   an acceleration electrode arranged between the sample and the detectors; and
   a sample application voltage control power supply that applies a first voltage to the sample,
   wherein the electric field acts in an azimuth direction of the secondary particles, and deflects the secondary particles emitted toward a region between the four detectors into a direction of a detection surface of each of the four detectors.

2. The charged particle beam device according to claim 1, wherein each of the four of electrodes is disposed between detectors adjacent to each other among the four detectors.

3. The charged particle beam device according to claim 2, wherein each of the four of electrodes has a shape that forms at least a portion of a cylindrical shape or a conical shape for covering at least a portion of each of the four detectors.

4. The charged particle beam device according to claim 1, wherein each of the four electrodes is disposed between the four detectors and the objective lens.

5. A charged particle beam device, comprising:
a charged particle source that generates a primary charged particle beam;
an objective lens that focuses the primary charged particle beam on a sample;
a plurality of detectors that are disposed closer to a side of the charged particle source than the objective lens, are disposed symmetrically around an optical axis of the primary charged particle beam, and detect secondary particles emitted by irradiating the sample with the primary charged particle beam;
an electrode that forms an electric field in a direction corresponding to each of the plurality of detectors between travel routes of secondary particles from the sample to the plurality of detectors; and
a control power supply that applies a voltage to the electrode,
wherein the electric field acts in an azimuth direction of the secondary particles, and deflects the secondary particles emitted toward a region between the plurality of detectors into a direction of a detection surface of each of the plurality of detectors,
wherein the electrode includes
a cylindrical portion kept at the same potential as the acceleration voltage of the primary charged particle beam, and
a plurality of plate-like electrodes disposed in a circumferential direction of the cylindrical portion.

6. A charged particle beam device, comprising:
a charged particle source that generates a primary charged particle beam;
an objective lens that focuses the primary charged particle beam on a sample;
a plurality of detectors that are disposed closer to a side of the charged particle source than the objective lens, are disposed symmetrically around an optical axis of the primary charged particle beam, and detect secondary particles emitted by irradiating the sample with the primary charged particle beam;
an electrode that forms an electric field in a direction corresponding to each of the plurality of detectors between travel routes of secondary particles from the sample to the plurality of detectors; and
a control power supply that applies a voltage to the electrode,
wherein the electric field acts in an azimuth direction of the secondary particles, and deflects the secondary particles emitted toward a region between the plurality of detectors into a direction of a detection surface of each of the plurality of detectors,
wherein the electrode includes
a cylindrical portion kept at the same potential as the acceleration voltage of the primary charged particle beam, and
a plurality of plate-like electrodes disposed in a circumferential direction of the cylindrical portion.
wherein the plurality of plate-like electrodes are insulated from the cylindrical portion and have a potential different from that of the cylindrical portion.

7. The charged particle beam device according to claim 1, further comprising:
a display portion that displays a voltage adjustment screen for adjusting the same voltage which is applied to each of the four electrodes or the different voltages applied to each of the four electrodes,
wherein the voltage adjustment screen includes
a sample image display portion which displays images generated in real time based on signals obtained from each of the four detectors in correspondence to each detector, and
an applied voltage adjustment portion which adjusts the same voltage or the different voltages applied to each of the four electrodes.

8. The charged particle beam device according to claim 1, wherein a display portion displays a mode selection portion which switches and selects between a first mode in which the same voltage is a positive voltage applied to each of the four electrodes, a second mode in which the same voltage is a negative voltage applied to each of the four electrodes, a third mode in which the same voltage applied to each of the four electrodes is zero volts, and a fourth mode in which the different voltages are applied to each of the four electrodes.

9. The charged particle beam device according to claim 1, wherein a second voltage applied to the acceleration electrode is a positive voltage, and the first voltage applied to the sample is a negative voltage.

10. The charged particle beam device according to claim 9, wherein the same voltage applied to each of the four electrodes is a negative voltage or the different voltages applied to each of the four electrodes are negative voltages.

11. The charged particle beam device according to claim 1, wherein the electrode including the four electrodes has an integrated structure.

12. The charged particle beam device according to claim 1, wherein each of electrode surfaces of the four electrodes is configured to influence orbits of the secondary particles and has one of a cylindrical shape, a conical shape, or a shape that forms a portion of the cylindrical shape or the conical shape.

13. The charged particle beam device according to claim 1, wherein the secondary particles are backscattered electrons.

* * * * *